US010897234B2

(12) United States Patent
Zamprogno et al.

(10) Patent No.: US 10,897,234 B2
(45) Date of Patent: Jan. 19, 2021

(54) FULLY DIFFERENTIAL OPERATIONAL AMPLIFIER COMMON MODE CURRENT SENSING FEEDBACK

(71) Applicant: STMicroelectronics S.r.l., Agrate Brianza (IT)

(72) Inventors: Marco Zamprogno, Cesano Maderno (IT); Simone Zezza, Corbetta (IT); Pasquale Flora, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 2 days.

(21) Appl. No.: 16/361,930

(22) Filed: Mar. 22, 2019

(65) Prior Publication Data
US 2020/0304085 A1 Sep. 24, 2020

(51) Int. Cl.
*H03F 3/45* (2006.01)
(52) U.S. Cl.
CPC .................. *H03F 3/45515* (2013.01)
(58) Field of Classification Search
CPC ........................................................ H03F 3/45

USPC ........................................ 330/257, 260, 261
See application file for complete search history.

(56) References Cited

U.S. PATENT DOCUMENTS

| 4,866,312 | A | * | 9/1989 | Kearney | ............. | H03F 3/45071 327/103 |
| 6,316,970 | B1 | * | 11/2001 | Hebert | ................ | H03F 3/45506 327/560 |
| 7,005,915 | B2 | * | 2/2006 | Kilian | .................... | G01D 3/021 330/11 |
| 2017/0123551 | A1 | | 5/2017 | Li et al. | | |

* cited by examiner

*Primary Examiner* — Henry Choe
(74) *Attorney, Agent, or Firm* — Seed IP Law Group LLP

(57) ABSTRACT

A method and apparatus for sensing a common mode feedback current are provided. The common mode feedback current may flow through a common mode resistive divider of a piezoresistive bridge. A first current mirror mirrors the common mode feedback current and provides a first mirrored common mode current. A current aggregation stage receives the first mirrored common mode current and determines a bridge current of the piezoresistive bridge based on the first mirrored common mode feedback current. A second current mirror may be used to mirror the first current mirror before determining the bridge current.

20 Claims, 2 Drawing Sheets

FULLY DIFFERENTIAL OPERATIONAL AMPLIFIER COMMON MODE CURRENT SENSING FEEDBACK

BACKGROUND

Technical Field

This application is directed to a device that senses a common mode feedback current and in particular a device that senses the common mode feedback current and uses the common mode feedback current to determine a bridge current of a piezoresistive bridge.

Description of the Related Art

Piezoresistive bridges, which may be Wheatstone bridges, are used in micro-electromechanical systems (MEMS) devices, such as micromirrors. Piezoresistive bridges are sensitive to temperature and the current flowing through a piezoresistive bridge may vary as the temperature varies. Due to their sensitivity to temperature, it is important to accurately and precisely determine the current flowing through a piezoresistive bridge and, consequently, the temperature of the piezoresistive bridge.

BRIEF SUMMARY

A fully differential operation amplifier in a current-to-voltage (I2V) converter configuration may be used to bias a piezoresistive bridge that is coupled in parallel with a common mode resistive divider between two nodes. The total current at one of the output nodes is the sum of the three currents; a first current flowing through the piezoresistive bridge, a second current flowing through the common mode resistive divider and a third current provided by a current source of the fully differential operation amplifier.

The first current flowing through the piezoresistive bridge may be used to determine the sensitivity of the piezoresistive bridge. Determining the first current accurately and precisely leads to a precise and accurate determination of the sensitivity of the piezoresistive bridge.

Described herein is a bridge current determination stage used to determine the first current flowing through the piezoresistive bridge. The bridge current determination stage initially determines the second current flowing through the common mode resistive divider. The bridge current determination stage then receives an indication of the third current provided by the current source of the fully differential operation amplifier. The bridge current determination stage determines the first current flowing through the piezoresistive bridge as the difference between the total current and the sum of the second and third currents.

DETAILED DESCRIPTION

Figure 1:
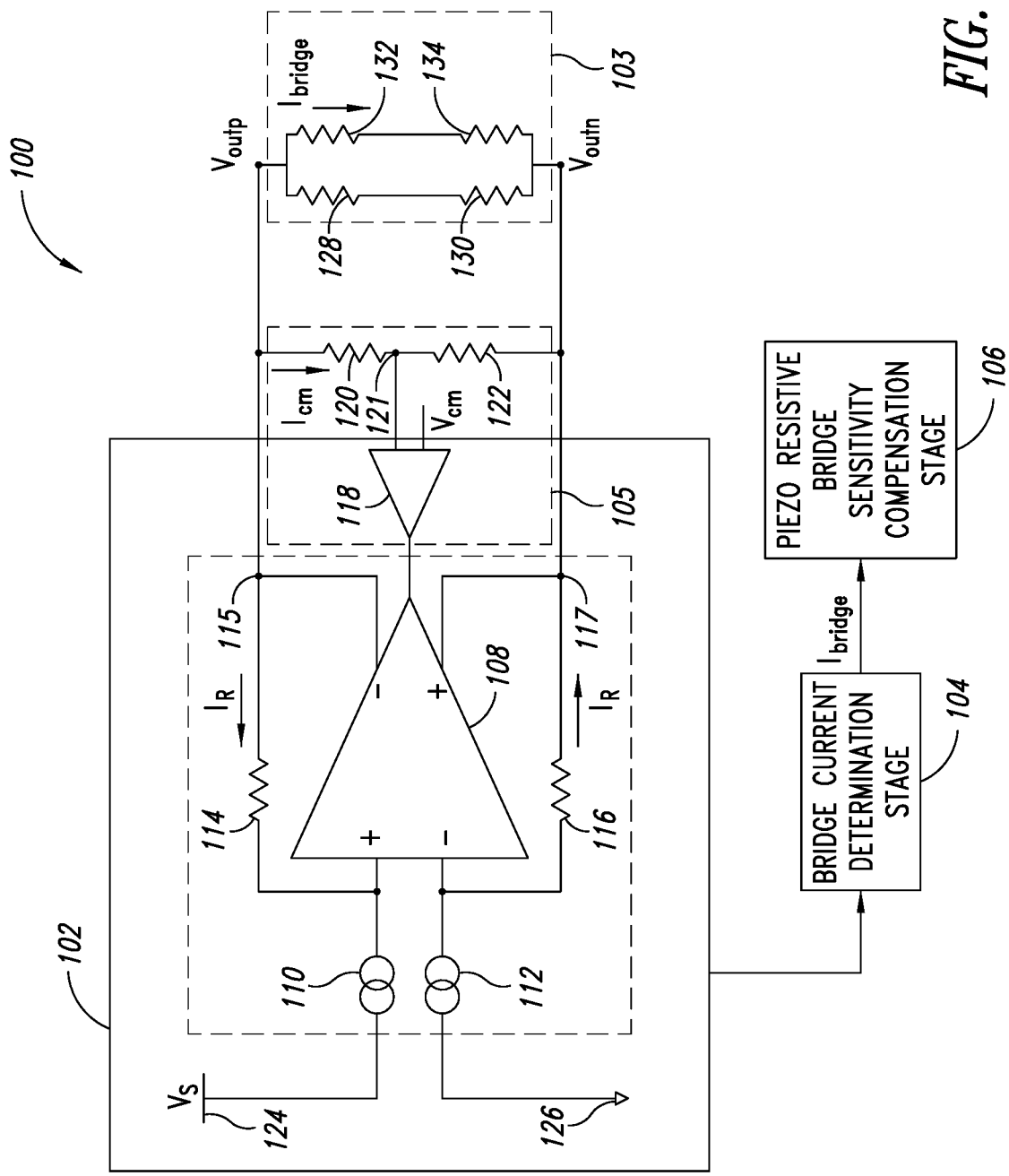
FIG. 1 shows a schematic circuit diagram of a MEMS system.

FIG. 1 shows a schematic circuit diagram of a MEMS system 100. The MEMS system 100 includes a piezoresistive bridge driving stage 102, a piezoresistive bridge 103, a bridge current determination stage 104, a common mode resistive divider 105, and a piezoresistive bridge sensitivity compensation stage 106. The bridge current determination stage 104 is coupled to the driving stage 102. The bridge current determination stage 104 determines a current flowing through the piezoresistive bridge 103 (Ibridge). The bridge current determination stage 104 outputs the current flowing through the piezoresistive bridge 103 (Ibridge) to the piezoresistive bridge sensitivity compensation stage 106. The sensitivity compensation stage 106 compensates for a temperature sensitivity of the piezoresistive bridge 103. The piezoresistive bridge 103 may be a Wheatstone bridge.

The diagram of FIG. 1 schematically illustrates the driving stage 102. The driving stage 102 includes a fully differential driving operational amplifier 108, first and second current sources 110, 112, first and second resistances 114, 116, and a feedback amplifier 118. The common mode resistive divider 105 has first and second feedback resistances 120, 122 with a tap node 121 therebetween. The common mode resistive divider 105 may be part of the operational amplifier 108 and may be a sub-structure of the operational amplifier 108. The fully differential structure of the operational amplifier 108, first and second feedback resistances 120, 122 and feedback amplifier 118 may fix the output common mode of the operational amplifier 108.

The first current source 110 has a first terminal coupled to a supply voltage node 124 and a second terminal coupled to a noninverting input of the driving operational amplifier 108. The supply voltage node 124 may provide a supply voltage (Vs) to the system 100. The second current source 112 has a first terminal coupled to a reference voltage node 126 and a second terminal coupled to an inverting input of the driving operational amplifier 108. The reference voltage node 126 may provide a reference voltage or a ground voltage to the system 100.

The first resistance 114 has a first terminal coupled to the noninverting input of the operational amplifier 108 and a second terminal coupled to a first output node 115 of the driving stage 102 at which a first output voltage (Voutp) is provided. The operational amplifier 108 has an inverting output terminal coupled to the first output node 115. The second resistance 116 has a first terminal coupled to the inverting input of the operational amplifier 108 and a second terminal coupled to a second output node 117 of the driving stage 102 at which a second output voltage (Voutn) is provided. A non-inverting output terminal of the operational amplifier 108 is coupled to the second output node 117.

The first feedback resistance 120 of the common mode resistive divider 105 has a first terminal coupled to the first output node 115 and a second terminal coupled to the tap node 121. The second feedback resistance 122 has a first terminal coupled to the second output node 117 and a second terminal coupled to the tap node 121. The feedback amplifier 118 has a second input for receiving a common mode voltage (Vcm). The feedback amplifier 118 has an output coupled to a control input of the driving operational amplifier 108.

The piezoresistive bridge 103 is coupled between the first and second output nodes 115, 117. In particular, the piezoresistive bridge 103 includes first, second, third and fourth resistances 128, 130, 132, 134, where the first and second resistances 128, 130 are coupled in series between the first and second output nodes 115, 117 and the third and fourth resistances 132, 134 are coupled in series between the first and second output nodes 115, 117. The resistances 128, 130, 132, 134 may have equal resistance values, and, accordingly, the piezoresistive bridge current (Ibridge) may flow through each branch of the piezoresistive bridge 103.

The system 100 may be employed in a micro-electromechanical systems (MEMS) micromirror. A position of the micromirror may be determined based on an output of the piezoresistive bridge 103. For example, an analog frontend (not shown) may read the common nets of the first and second resistances 128, 130 and the third and fourth resistances 132, 134. The analog frontend may be coupled to the common nets. Micromirror movement induces a mismatch between (or a change in) the values of the resistances 128, 130, 132, 134, which leads to an effective voltage between the two common nets. Depending the placement of the piezoresistive bridge 103 on the micromirror, the mismatch causes an effective signal to be generated between the two output terminals of the piezoresistive bridge 103. The sensitivity of the micromirror may be a "gain" between physical movement of the mirror and resistance variation. The sensitivity (or a sensitivity parameter) may be deemed as a propensity or capability of the piezoresistive bridge 103 to be mismatched for a given movement of the micromirror. Accordingly, the sensitivity (or parameter thereof) may be a coefficient linking micromirror movement to the generated electrical signal. This sensitivity is temperature-dependent. Tracking the temperature (or variations thereof) allows for compensating for the sensitivity.

As described herein, reading the current through the piezoresisitve bridge (Ibridge) allows for determining temperature and extrapolating an updated value of the sensitivity. Both the relationships between resistance (and measured current) and temperature and sensitivity and temperature are assumed known and properly calibrated.

The piezoresistive bridge 103 has a varying sensitivity in relation to temperature. To determine the sensitivity of the bridge 103, the bridge current (Ibridge) is determined and used first to determine the temperature. It is desirable to accurately estimate the bridge current (Ibridge) in order to compensate for the variation in the sensitivity of the bridge 103 and, consequently, to precisely determine the position (movement) of the micromirror.

As described herein, the bridge current determination stage 104 determines the bridge current (Ibridge). The bridge current determination stage 104 outputs the bridge current (Ibridge) to the piezoresistive bridge sensitivity compensation stage 106. The piezoresistive bridge sensitivity compensation stage 106 uses the bridge current (Ibridge) to identify a temperature of the piezoresistive bridge 103 and, thus, a sensitivity of a micromirror or other device using the piezoresistive bridge 103. The piezoresistive bridge sensitivity compensation stage 106 may be a controller or processor, among others, for a MEMS device, such as a micromirror.

It is advantageous to have the fully differential operation amplifier 108 and bias circuit used for the piezoresistive bridge 103 in a current-to-voltage (I2V) configuration. As such the output of the operational amplifier 108 is function of a known current provided by the first and second current sources 110, 112 and the resistive current ($I_R$) flowing through the resistances 114, 116. The output may be determined from such known quantities.

Figure 2:
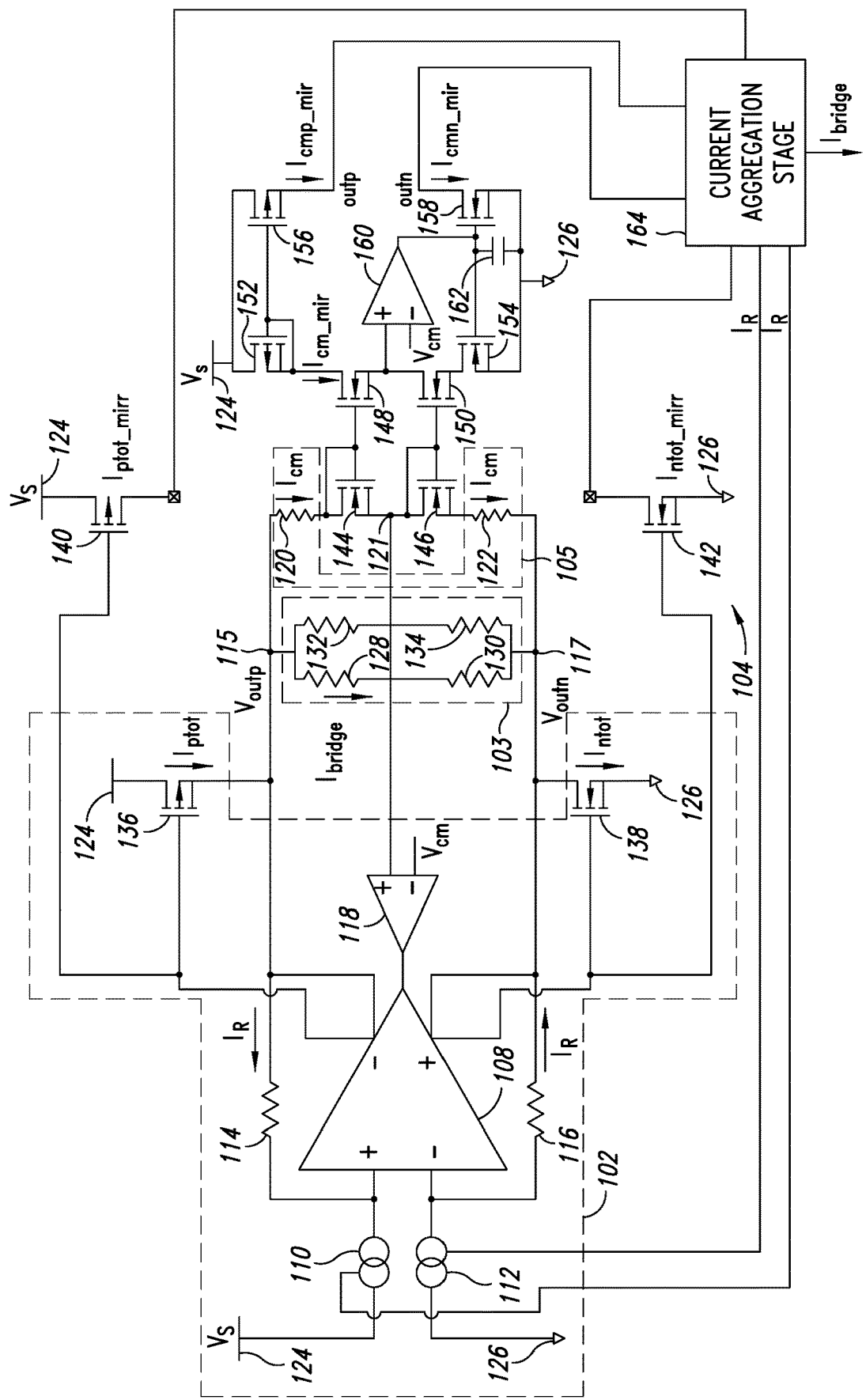
FIG. 2 shows a schematic circuit of the MEMS system including further details of a bridge current determination stage.

FIG. 2 shows a circuit diagram of the MEMS system 100 including further details of the bridge current determination stage 104. Similar elements of the driving stage 102 and the piezoresistive bridge 103 described with reference to FIG. 1 herein have the same reference numerals.

The bridge current determination stage 104 includes first and second total current transistors 136, 138, first and second total current mirror transistors 140, 142, first and second feedback transistors 144, 146 in a transdiode configuration in the common mode resistive divider 105, first, second, third and fourth mirror transistors 148, 150, 156, 158, first and second reference transistors 152, 154, a mirror feedback amplifier 160 and a capacitance 162. The bridge current determination stage 104 also includes a current aggregation stage 164. The current aggregation stage 164 may be a current adder and/or subtractor. The current aggregation stage 164 may further be a controller or processor, among others. While the first and second total current transistors 136, 138 are extrapolated in FIG. 2, in various implementations, the first and second total current transistors 136, 138 may be output devices of the operational amplifier 108. The first and second reference transistors 152, 154 are configured in a transdiode topology as a reference for the third and fourth mirror transistors 156, 158.

The first total current transistor 136 has a source coupled to the supply voltage node 124, a drain that is coupled to the first output node 115 and a gate connected to an internal net of the operational amplifier 108 accordingly to its specific architecture. The second total current transistor 138 has a source coupled to the reference voltage node 126, a drain that is coupled to the second output node 117 and a gate connected to an internal net of the operational amplifier 108. The first and second total current mirror transistors 140, 142 are in a current mirror configuration with the first and second total current transistors 136, 138, respectively. The first total current mirror transistor 140 has a source coupled to the supply voltage node 124, a gate coupled to the gate of the first second total current transistor 136 and a drain coupled to a first input of the current aggregation stage 164. The second total current mirror transistor 142 has a source coupled to the reference voltage node 126, a gate coupled to the gate of the second total current transistor 138 and a drain coupled to a second input of the current aggregation stage 164.

The first feedback transistor 144 is serially coupled with the first feedback resistance 120 and in a transdiode configuration, whereby the first feedback transistor 144 has a drain and a gate that are both coupled to the second terminal of the first feedback resistance 120 and a source that is coupled to the tap node 121. The second feedback transistor 146 is serially coupled with the second feedback resistance 122 and in a transdiode configuration, whereby the second feedback transistor 146 has a drain and a gate that are both coupled to the tap node 121 and a source that is coupled to the second terminal of the second feedback resistance 122.

The first and second mirror transistors 148, 150 are in a current mirror configuration with the first and second feedback transistors 144, 146, respectively, whereby the first mirror transistor 148 has a gate coupled to the gate of the first feedback transistor 144 and the second mirror transistor 150 has a gate coupled to the gate of the second feedback transistor 146. The drain of second mirror transistor 150 is coupled to the noninverting input of the mirror feedback amplifier 160. The drain of the first mirror transistor 148 is coupled to a control terminal of a first reference transistor 152 described herein (and its drain). The source of the first mirror transistor 148 is coupled to the noninverting input of the mirror feedback amplifier 160 and the source of the second mirror transistor 150 is coupled to a drain of a second reference transistor 154 described herein.

The first reference transistor 152 has a source coupled to the supply voltage node 124 and a gate and a drain that the coupled to each other and together coupled to the drain of the first mirror transistor 148. The second reference transistor 154 has a source coupled to the reference voltage node 126 and a drain coupled to the source of the second mirror transistor 150.

The third and fourth mirror transistors 156, 158 are in a current mirror configuration with the first and second reference transistors 152, 154, respectively. The third mirror transistor 156 has a source coupled to the supply voltage node 124, a gate coupled to the gate of the first reference transistors 152 and a drain coupled to a third input of the current aggregation stage 164. The fourth mirror transistor 158 has a source coupled to the reference voltage node 126, a gate coupled to the gate of the second reference transistor 154 and a drain coupled to a fourth input of the current aggregation stage 164.

An output of the mirror feedback amplifier 160 is coupled to the gates of the second reference transistor 154 and fourth mirror transistor 158. The capacitance 162 is coupled between the gates of the second reference transistor 154 and fourth mirror transistor 158 and the reference voltage node 126. Additionally, the current aggregation stage 164 has fifth and sixth inputs coupled to a replica of the first and second current sources 110, 112, respectively. The current aggregation stage 164 receives from the first and second current sources 110, 112 an indication of (or a copy of) the currents provided by the first and second current sources 110, 112.

The piezoresistive bridge current (Ibridge) may be represented as the difference between a total current (Iptot) flowing through the first total current transistor 136 and a sum of (i) a common mode feedback current (Icm) flowing through the common mode resistive divider 105 made of the first and second feedback resistances 120, 122 and (ii) a resistive current ($I_R$) flowing through the first resistance 114. The total current (Iptot) passing through the first total current transistor 136 is distributed to the resistive divider (as the common mode feedback current (Icm)), the bridge 103 (as the piezoresistive bridge current (Ibridge)) and the resistive current ($I_R$) flowing through the first resistance 114.

The piezoresistive bridge current (Ibridge) may be determined as a difference between a total current (Iptot) and a sum of the common mode feedback current (Icm) and the resistive current ($I_R$). The piezoresistive bridge current (Ibridge) may be determined as:

$$\text{Ibridge} = \text{Iptot} - \text{Icm} - I_R. \quad \text{Equation (1)}$$

The resistive current ($I_R$) is entirely provided by the first current source 110 and may be determined based on data or the from the first current source 110.

The total current (Iptot) entirely flows through the first output node 115. Due to the placement of the first total current mirror transistor 140 in a current mirror configuration with the first total current transistor 136, the total current (Iptot) is copied to the first total current mirror transistor 140 and may be sourced (or determined) at the drain of the first total current mirror transistor 140.

To determine the common mode feedback current (Icm) flowing through the common mode feedback resistive divider 105, the conductive terminals of the first and second feedback transistors 144, 146 are inserted in the path of the common mode feedback current (Icm). The first and second mirror transistors 148, 150 are placed in a current mirror configuration with the first and second feedback transistors 144, 146, respectively.

The first and second reference transistors 152, 154 source or drain current to the first and second mirror transistors 148, 150, respectively. The mirror feedback amplifier 160 may be a replica of the feedback amplifier 118 or may be a different amplifier. Due to the feedback, the mirror feedback amplifier 160 allows for setting the intermediate node between the first and second mirror transistors 148, 150 to Vcm. Matching between the mirror feedback amplifier 160 and the feedback amplifier 118 may (at the second order) provide better (e.g., more equal) bias at Vcm between the tap node 121 and the common net between the first and second mirror transistors 148, 150.

The tap node 121 that is an intermediate between to the first and second feedback transistors 144, 146 is also set to Vcm in the common mode feedback of the operational amplifier 108. Due to the fact that the first and second mirror transistors 148, 150 are sought to mirror the first and second feedback transistors 144, 146, respectively, and due to the fact that they have the same gate voltage, it is important that they have also the same source voltage. This is performed through the feedback managed by the mirror feedback amplifier 160.

Furthermore, the first and second feedback transistors 144, 146 and the first and second mirror transistors 148, 150 have body-source connection to avoid Body effect that will impact the mirroring factor. Additionally, the transistors 144, 146, 148, 150 may be further cascode in order to improve matching and may advantageously the same or proportional sizes.

The current flowing through the first reference transistor 152 (denoted 'Icm_mirr'), which in itself is a mirror of the common mode feedback current (Icm), is copied by the third mirror transistor 156. The third mirror transistor 156 is in a current mirror configuration with the first reference transistor 152, and, therefore, the current flowing through the first reference transistor 152 (Icm_mirr) is again mirrored as a current Icmp_mirr by the third mirror transistor 156. The third mirror transistor 156 provides the mirror current (Icmp_mirr) of the common mode feedback current (Icm) to the current aggregation stage 164.

The current aggregation stage 164 receives the mirror current (Icmp_mirr) of the common mode feedback current (km) from the third mirror transistor 156 and the mirror current (Iptot_mirr) of the total current (Iptot) from the first total current mirror transistor 140. The current aggregation stage 164 also receives from the first current source 110 an indication of the resistive current ($I_R$). The current aggregation stage 164 may generate the resistive current ($I_R$) based the received indication. The current aggregation stage 164 subtracts both the mirror current (Temp_mirr) of the common mode feedback current (km) and the generated resistive current (IR) from the mirror current (Iptot_mirr) of the total current (Iptot) to produce a mirrored replica of the piezoresistive bridge current (Ibridge). The current aggregation stage 164 determines the piezoresistive bridge current (Ibridge) according to Equation (1) and based on the measured currents.

Due to the symmetry of both the driving stage 102 and the current determination stage 104, the current aggregation stage 164 may also receive currents from the 'negative' side of the driving stage 102 and the current determination stage 104. The current determination stage 104 receives a mirror current (Intot_mirr) of the total current (Intot) passing through the second total current transistor 138, a mirror current (Icmn_mirr) of the common mode feedback current (Icm) passing through the second feedback transistor 146 and an indication of the resistive current ($I_R$) passing through the second resistance 116. In a similar manner as described herein, the current aggregation stage 164 determines the piezoresistive bridge current (Ibridge) as $$\text{Ibridge} = \text{Intot\_mirr} - \text{Icmn\_mirr} - I_R. \quad \text{Equation (2)}$$

The current aggregation stage 164 may output the piezoresistive bridge current (Ibridge). The piezoresistive bridge current (Ibridge) may be used to determine a sensitivity of the piezoresistive bridge 103 or a device associated with the bridge 103, such as a MEMS device. As described herein, the piezoresistive bridge current (Ibridge) is indicative of a temperature of the bridge 103. The piezoresistive bridge current (Ibridge) may be used to determine a temperature of the bridge 103. The temperature of the bridge 103 may then be used to determine a sensitivity of the bridge 103, which varies according to temperature. The temperature of the bridge 103 is then used to compensate for the sensitivity of the bridge 103. The current determination stage 104 accurately determines the common mode feedback current (Icm), which consequently results an accurate determination of the piezoresistive bridge current (Ibridge).

In an embodiment, power consumption may be minimized by scaling the current of the mirror currents (Iptot_mirr and Intot_mirr) of the total current (Iptot and Intot) by a factor (for example, k). The mirror currents (Iptot_mirr and Intot_mirr) may be multiplied by the factor to compensate for scaling the mirror currents. In the event that the mirror currents (Iptot_mirr and Intot_mirr) are scaled by the factor k, the piezoresistive bridge current (Ibridge) may be determined as:

$$\text{Ibridge} = k^*(\text{Iptot\_mirr} - \text{Icmn\_mirr} - I_R). \quad \text{Equation (3)}$$

The sensitivity compensation stage 106 may perform temperature sensitivity compensation as described herein. The relationship between the resistance of the piezoresistive bridge 103 and temperature may be represented as:

$$R(T) = T(T0)(1 + A(T-T0) + B(T-T0)^2), \quad \text{Equation (4)}$$

where T represents temperature, T0 is a reference temperature (e.g., 27° C.) and A and B are thermal coefficients dependent on technology.

The bridge current may, in turn, be represented as:

$$I(T) = V/R(T), \quad \text{Equation (5)}$$

where V is the bias voltage applied to the bridge.

Assuming A and B known (after calibration, for instance), a measure of I(T) allows for determining the temperature T. The sensitivity of the bridge itself may be defined by:

$$S(T) = R(T0)(1 + C(T-T0) + D(T-T0)^2), \quad \text{Equation (6)}$$

where C and D are thermal coefficients dependent on the technology.

When C and D known, the sensitivity may be determined following the determination of the temperature T. Further, the movement (or position) of the micromirror may be determined from the outputs of the bridge. The angle of the micromirror in a given instant (θ) may be represented as:

$$\text{Vout} = VS\theta \quad \text{Equation (7)}$$

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a common mode resistive divider including first and second resistances that are coupled in series;
   a piezoresistive bridge;
   a first current mirror, coupled to the common mode resistive divider, configured to mirror a common mode current flowing through the common mode resistive divider and provide a first mirrored common mode current, the first current mirror including a first feedback transistor that is coupled in series with the first and second resistances and that has the common mode current flowing therethrough; and
   a current aggregation stage configured to receive the first mirrored common mode current and determine a bridge current of the piezoresistive bridge based on the first mirrored common mode feedback current.

2. The device of claim 1, comprising:
   a driving operational amplifier operative to the bias piezoresistive bridge.

3. The device of claim 2, wherein the piezoresistive bridge is coupled in parallel with the common mode resistive divider, and wherein the current aggregation stage is configured to:
   receive a mirror of an output current of the driving operational amplifier used to bias the piezoresistive bridge;
   receive an indication of a feedback current of the driving operational amplifier; and
   determine the bridge current based on the output current and the feedback current of the driving operational amplifier.

4. The device of claim 3, wherein the current aggregation stage is configured to determine the bridge current as a difference between the mirror of the output current and a sum of the first mirrored common mode feedback current and the feedback current of the driving operational amplifier.

5. The device of claim 1, wherein:
   the first resistance has a first terminal coupled to a first voltage node and a second terminal; and
   the second resistance has a first terminal coupled to a second voltage node and a second terminal.

6. The device of claim 5, wherein the first current mirror includes:
   the first feedback transistor having a first conductive terminal and a control terminal that are both coupled to the second terminal of the first resistance, and a second conductive terminal coupled to the center node;
   a second feedback transistor having a first conductive terminal and a control terminal coupled to the center node, and a second conductive terminal coupled to the second terminal of the second resistance;
   a first mirror transistor having a control terminal coupled to the control terminal of the first feedback transistor and first and second conductive terminals; and
   a second mirror transistor having a control terminal coupled to the control terminal of the second feedback transistor, a first conductive terminal coupled to the first conductive terminal of the first mirror transistor and a second conductive terminal.

7. The device of claim 6, comprising:
   a mirror feedback amplifier having a first input coupled to the first conductive terminals of the first and second mirror transistors, a second input for receiving a common mode voltage, and an output.

8. The device of claim 7, comprising:
   a second current mirror including:
   a first current source transistor having a first conductive terminal and a control terminal that are both coupled to the second conductive terminal of the first mirror transistor and a second conductive terminal coupled to a supply voltage node; and
a second current source transistor having a first conductive terminal coupled to the second conductive terminal of the second mirror transistor, a second conductive terminal coupled to a reference voltage node and a control terminal coupled to the output of the mirror feedback amplifier.

9. The device of claim 8, wherein the second current mirror includes:
a third mirror transistor having a control terminal coupled to the control terminal of the first current source transistor, a first conductive terminal coupled to the supply voltage node and a second conductive terminal coupled to the current aggregation stage;
a fourth mirror transistor having a control terminal coupled to the control terminal of the second current source transistor, a first conductive terminal coupled to the reference voltage node and a second conductive terminal coupled to the current aggregation stage; and
a capacitance coupled between the output of the mirror feedback amplifier and the reference voltage node.

10. A method, comprising:
mirroring, by a first current mirror, a common mode current flowing through a common mode resistive divider for a piezoresistive bridge to produce a first mirrored common mode current, the common mode resistive divider including first and second resistances that are coupled in series, and the first current mirror including a first feedback transistor that is coupled in series with the first and second resistances and that has the common mode current flowing therethrough; and
determining a bridge current of the piezoresistive bridge based on the first mirrored common mode feedback current.

11. The method of claim 10, comprising:
biasing, by an operational amplifier, the piezoresistive bridge.

12. The method of claim 11, comprising:
determining a mirror of an output current of the driving operational amplifier used to bias the piezoresistive bridge;
receiving an indication of a feedback current of the operational amplifier; and
determining the bridge current based on the output current and the feedback current of the driving operational amplifier.

13. The method of claim 12, comprising:
mirroring the first mirrored common mode current to produce a second mirrored common mode current based on the first mirrored common mode current; and
determining the bridge current as a difference between the output current and a sum of the second mirrored common mode feedback current and the feedback current of the driving operational amplifier.

14. A micro-electromechanical systems (MEMS) system, comprising:
a first current mirror, coupled to a common mode resistive divider of a piezoresistive bridge, configured to mirror a common mode current flowing through the common mode resistive divider and provide a first mirrored common mode current, the common mode resistive divider including first and second resistances that are coupled in series, and the first current mirror including a first feedback transistor that is coupled in series with the first and second resistances and that has the common mode current flowing therethrough;
a current aggregation stage configured to receive the first mirrored common mode current and determine a bridge current of the piezoresistive bridge based on the first mirrored common mode feedback current; and
a piezoresistive bridge sensitivity compensation stage configured to receive the bridge current and compensate a sensitivity of a MEMS device based on the bridge current.

15. The MEMS system of claim 14, comprising:
a driving operational amplifier operative to bias the piezoresistive bridge.

16. The MEMS system of claim 15, wherein the current aggregation stage is configured to:
receive a mirror of an output current of the driving operational amplifier used to bias the piezoresistive bridge;
receive an indication of a feedback current of the driving operational amplifier; and
determine the bridge current based on the output current and the feedback current of the driving operational amplifier.

17. The MEMS system of claim 16, wherein the current aggregation stage is configured to determine the bridge current as a difference between the output current and a sum of the first mirrored common mode feedback current and the feedback current of the driving operational amplifier.

18. The MEMS system of claim 14, wherein:
the first resistance has a first terminal coupled to a first voltage node and a second terminal;
the second resistance has a first terminal coupled to a second voltage node and a second terminal;
the common mode resistive divider includes a center node; and
the first feedback transistor has a first conductive terminal and a control terminal that are both coupled to the second terminal of the first resistance, and a second conductive terminal coupled to the center node;
the first current mirror includes:
a second feedback transistor having a first conductive terminal and a control terminal coupled to the center node, and a second conductive terminal coupled to the second terminal of the second resistance;
a first mirror transistor having a control terminal coupled to the control terminal of the first feedback transistor and first and second conductive terminals; and
a second mirror transistor having a control terminal coupled to the control terminal of the second feedback transistor, a first conductive terminal coupled to the first conductive terminal of the first mirror transistor and a second conductive terminal.

19. The MEMS system of claim 14, comprising:
a second current mirror, coupled to the first current mirror, configured to mirror the first mirrored common mode current and provide a second mirrored common mode current.

20. The MEMS system of claim 18, comprising:
a mirror feedback amplifier having a first input coupled to the first conductive terminals of the first and second mirror transistors, a second input for receiving a common mode voltage, and an output.

* * * * *